# (12) United States Patent
Kim et al.

(10) Patent No.: US 8,227,349 B2
(45) Date of Patent: Jul. 24, 2012

(54) METHOD OF FORMING A MASK PATTERN, METHOD OF FORMING A MINUTE PATTERN, AND METHOD OF MANUFACTURING A SEMICONDUCTOR DEVICE USING THE SAME

(75) Inventors: Hyoung-Hee Kim, Hwaseong-si (KR); Yool Kang, Yongin-si (KR); Seong-Ho Moon, Yongin-si (KR); Seok-Hwan Oh, Seoul (KR); So-Ra Han, Bucheon-si (KR); Seong-Woon Choi, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 142 days.

(21) Appl. No.: 12/873,574

(22) Filed: Sep. 1, 2010

(65) Prior Publication Data

US 2011/0053362 A1 Mar. 3, 2011

(30) Foreign Application Priority Data

Sep. 2, 2009 (KR) .................. 10-2009-0082645

(51) Int. Cl.
*H01L 21/461* (2006.01)
*H01L 21/302* (2006.01)
*H01L 21/469* (2006.01)
*H01L 21/3205* (2006.01)

(52) U.S. Cl. .................. 438/689; 438/761; 438/585

(58) Field of Classification Search .......... 438/585, 438/689, 761
See application file for complete search history.

(56) References Cited

U.S. PATENT DOCUMENTS

| 5,741,625 A * | 4/1998 | Bae et al. ................ 430/312 |
| 6,379,869 B1 * | 4/2002 | Schroeder et al. ........... 430/313 |
| 7,361,609 B2 | 4/2008 | Hah et al. |
| 2004/0009436 A1 * | 1/2004 | Lee et al. ................ 430/313 |
| 2008/0199806 A1 * | 8/2008 | Hatakeyama et al. ..... 430/270.1 |
| 2009/0087786 A1 * | 4/2009 | Hatakeyama .............. 430/285.1 |
| 2010/0062379 A1 * | 3/2010 | Iwashita .................. 430/326 |
| 2010/0093172 A1 * | 4/2010 | Kim et al. ................ 438/689 |

FOREIGN PATENT DOCUMENTS

| JP | 2008-298862 A | 12/2008 |
| JP | 2009-042582 A | 2/2009 |
| KR | 10-2006-0027523 A | 3/2006 |

* cited by examiner

*Primary Examiner* — Luan C Thai
(74) *Attorney, Agent, or Firm* — Lee & Morse, P.C.

(57) ABSTRACT

A method of forming a mask pattern, a method of forming a minute pattern, and a method of manufacturing a semiconductor device using the same, the method of forming the mask pattern including forming first mask patterns on a substrate; forming first preliminary capping layers on the first mask patterns; irradiating energy to the first preliminary capping patterns to form second preliminary capping layers ionically bonded with the first mask patterns; applying an acid to the second preliminary capping layers to form capping layers; forming a second mask layer between the capping layers, the second mask layer having a solubility lower than that of the capping layers; and removing the capping layers to form second mask patterns.

20 Claims, 11 Drawing Sheets

METHOD OF FORMING A MASK PATTERN, METHOD OF FORMING A MINUTE PATTERN, AND METHOD OF MANUFACTURING A SEMICONDUCTOR DEVICE USING THE SAME

BACKGROUND

1. Field

Embodiments relate to a method of forming a mask pattern, a method of forming a minute pattern, and a method of manufacturing a semiconductor device using the same.

2. Description of the Related Art

A highly integrated semiconductor device may include minute patterns. In order to form a plurality of elements in a small area, it may be desirable to reduce a size of each of the elements. Thus, the patterns may have a narrow width and a narrow pitch therebetween.

Recently, as a design rule of the semiconductor device has been decreased, forming a pattern having a minute pitch has been restricted because of a resolution limit of a photolithography process. In order to overcome the resolution limit of the photolithography process, methods of forming a minute hard mask pattern using a double patterning process have been proposed.

SUMMARY

Embodiments are directed to a method of forming a mask pattern, a method of forming a minute pattern, and a method of manufacturing a semiconductor device using the same, which represents advances over the related art.

It is a feature of an embodiment to provide a method of readily forming a mask pattern using a double patterning process.

At least one of the above and other features and advantages may be realized by providing a method of forming a mask pattern, the method including forming first mask patterns on a substrate; forming first preliminary capping layers on the first mask patterns; irradiating energy to the first preliminary capping patterns to form second preliminary capping layers ionically bonded with the first mask patterns; applying an acid to the second preliminary capping layers to form capping layers; forming a second mask layer between the capping layers, the second mask layer having a solubility lower than that of the capping layers; and removing the capping layers to form second mask patterns.

The acid may include nonafluorobutanesulfonic acid or camphorsulfonic acid.

The capping layers may include a heterocyclic compound having a nitrogen atom.

The capping layers may be attached to the first mask patterns by ionically bonding the nitrogen atom with a hydrogen atom in the first mask patterns.

Removing the capping layers may include applying an alkaline solution to the capping layers.

Forming the second mask patterns may include adjusting a width thereof by diffusion of acid from the capping layers.

The first mask patterns may have a width substantially the same as a width of the second mask patterns.

At least one of the above and other features and advantages may also be realized by providing a method of forming a minute pattern, the method including forming a layer on a substrate; forming first mask patterns on the layer; forming first preliminary capping layers on the first mask patterns; irradiating energy to the first preliminary capping patterns to form second preliminary capping layers ionically bonded with the first mask patterns; applying acid to the second preliminary capping layers to form capping layers; forming a second mask layer between the capping layers, the second mask layer having a solubility lower than that of the capping layers; removing the capping layers to form second mask patterns; and etching the layer using the first mask patterns and the second mask patterns as an etch mask to form the minute pattern.

The layer may include a metal layer or a conductive layer doped with impurities.

Removing the capping layers may include applying a tetramethylammonium hydroxide (TMAH) solution to the capping layers.

Forming the second mask patterns may include partially removing portions of the second mask patterns to reduce widths of the second mask patterns.

The first mask patterns may include an organic material.

At least one of the above and other features and advantages may also be realized by providing a method of manufacturing a semiconductor device, the method including forming an electrode layer on a substrate; forming first mask patterns on the electrode layer; forming first preliminary capping layers on the first mask patterns; irradiating energy to the first preliminary capping patterns to form second preliminary capping layers ionically bonded with the first mask patterns; applying an acid to the second preliminary capping layers to form capping layers; forming a second mask layer between the capping layers, the second mask layer having a solubility lower than that of the capping layers; removing the capping layers to form second mask patterns; and etching the electrode layer using the first mask patterns and the second mask patterns as an etch mask to form gate electrodes.

The semiconductor device may include a flash memory device.

The method may further include forming an isolation layer in the substrate.

The gate electrodes may have substantially the same width.

The method may further include forming a control gate over the gate electrodes.

The gate electrodes may include a metal layer or a conductive layer doped with impurities.

Forming the second mask patterns may include adjusting a width thereof by diffusion of acid from the capping layers.

The capping layers may include a heterocyclic compound having a nitrogen atom.

BRIEF DESCRIPTION OF THE DRAWINGS

The above and other features and advantages will become more apparent to those of ordinary skill in the art by describing in detail exemplary embodiments with reference to the attached drawings, in which:.

DETAILED DESCRIPTION

Figure 1:
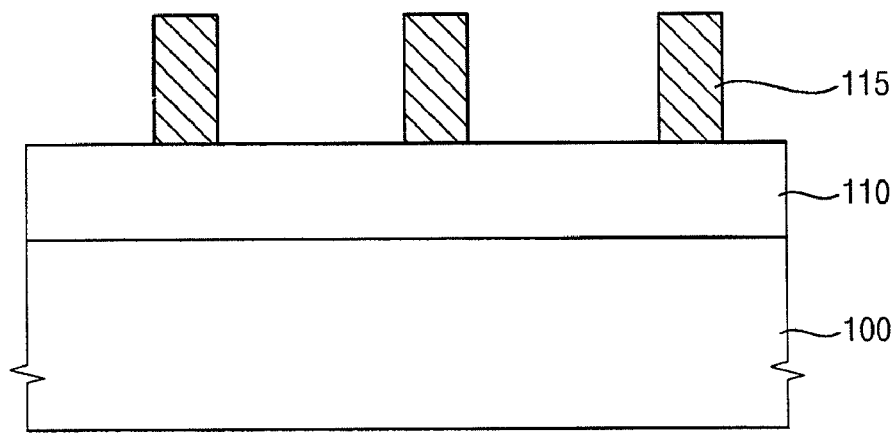
FIGS. 1 to 8 illustrate cross-sectional views of stages in a method of manufacturing a semiconductor device in accordance with an embodiment.

Korean Patent Application No. 10-2009-0082645, filed on Sep. 2, 2009 in the Korean Intellectual Property Office, and entitled: "Method of Forming A Mask Pattern, Method of Forming A Minute Pattern and Method of Manufacturing A Semiconductor Device Using the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout It will be understood that when an element or layer is referred to as being "connected to" another element or layer, it can be directly connected to the other element or layer or intervening elements or layers may be present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 8 illustrate cross-sectional views of stages in a method of manufacturing a semiconductor device in accordance with an embodiment.

Referring to FIG. 1, a layer 110 may be formed on a semiconductor substrate 100. A plurality of first mask patterns 115 may be formed on the layer 110. In an implementation, the first mask patterns 115 may be spaced apart from each other by a substantially same interval. Particularly, the interval between the first mask patterns 115 may be about two times as long as a pitch of a desired minute pattern to be formed in the layer 110.

In an implementation, the semiconductor substrate 100 may include, e.g., a silicon substrate, a silicon germanium substrate, etc.

In an implementation, the layer 110 may include various materials in consideration of kinds of the desired pattern. For example, when a gate electrode is to be formed from the layer 110 on the semiconductor substrate 100, the layer 110 may include a conductive layer, e.g., a doped polysilicon layer, a metal silicide layer, etc. When a bit line or a metal wiring is to be formed from the layer 110 on the semiconductor substrate 100, the layer 110 may include a metal layer, e.g., a tungsten layer, an aluminum layer, etc.

In an implementation, the first mask pattern 115 may include, e.g., a photoresist pattern. Particularly, the first mask pattern 115 may include, e.g., a positive type photoresist containing photoacid generator (PAG). For example, the first mask pattern 115 may include KrF excimer-laser (248 nm) photoresist, ArF excimer-laser (193 nm) photoresist, $F_2$ excimer-laser (157 nm) photoresist, etc. In another implementation, the first mask pattern 115 may include, e.g., a negative type photoresist.

The first mask patterns 115 may then be cured. In an implementation, the curing process may use, e.g., heat, Ar plasma, HBr plasma, etc. When the curing process includes heating, the first mask patterns 115 may be thermally treated at a temperature of about 50° C. to about 200° C. for about 1 minute. When the curing process includes use of the HBr plasma, the curing process may include placing the semiconductor substrate 100 having the first mask patterns 115 thereon on an electrostatic chuck (ESC) of a plasma chamber, supplying an HBr gas to the plasma chamber and applying a power to the plasma chamber to generate the HBr plasma. In order to generate the HBr plasma, the curing process may further include applying a source power of about 10 W to about 2,000 W to an upper electrode of the plasma chamber, and applying a bias power of about 10 W to the ESC. Additionally, the curing process may include supplying at least one of, e.g., $H_2$, $N_2$, and $C_xH_y$, to the plasma chamber. Here, a small amount of energy, e.g., ultraviolet (UV) rays or heat, may be generated during the curing process using the HBr plasma. Further, various reactive materials, e.g., ions, radicals, etc., may be generated during the curing process using the HBr plasma. The energy or the reactive materials may cure the first mask patterns 115 under conditions wherein the energy or the reactive materials do not have influence on, i.e., do not change, a width of the first mask patterns 115.

Here, non-cured portions of the first mask patterns 115 may be dissolved in an organic solvent. Thus, the curing process may prevent the first mask patterns 115 from being intermixed with other adjacent layers. Accordingly, the cured first mask patterns 115 may be insoluble with respect to the organic solvent, e.g., propylene glycol methyl ether acetate (PGMEA), ethyl lactate (EL), cyclohexanone, etc.

Figure 2:
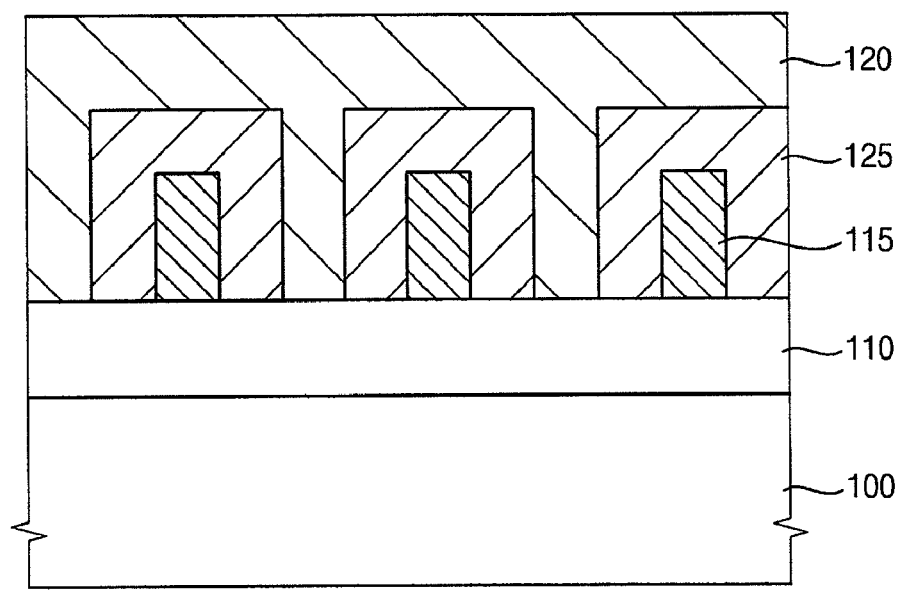

Referring to FIG. 2, a first preliminary capping layer 120 may be formed on the layer 110 to cover the first mask patterns 115.

In an implementation, the first preliminary capping layer 120 may include, e.g., a hydrophilic organic compound. Further, the first preliminary capping layer 120 may include, e.g., a heterocyclic compound having a nitrogen atom and/or a polymer including a substituent that has a heterocyclic compound having a nitrogen atom. For example, the first preliminary capping layer 120 may include a pyrrolidone polymer. The first preliminary capping layer 120 may include a soluble polymer. For example, the first preliminary capping layer 120 may include a copolymer having a first repeating unit having a pyrrolidone group and a second repeating unit having a structure different from that of the first repetitive unit. The second repeating unit may include, e.g., an acrylamide monomer unit, a vinyl monomer unit, an alkylene glycol monomer unit, a maleic anhydride monomer unit, an ethylene imine monomer unit, a monomer unit having an oxazoline group, an acrylonitrile monomer unit, an alylated amide monomer unit, a 3,4-dihydropyran monomer unit, a 2,3-dihydrofuran monomer unit, etc.

The substrate 100 including the first preliminary capping layer 120 thereon may then be baked or irradiated with energy to form a second preliminary capping layer 125 on upper surfaces and side surfaces of the first mask patterns 115. In an implementation, the substrate 100 including the first preliminary capping layer 120 thereon may be baked at a temperature of about 120° C. to about 180° C. for about 20 seconds to about 70 seconds.

In an implementation, the second preliminary capping layer 125 may have a thickness varying in accordance with a width of a desired pattern to be formed in the layer 110. For example, a portion of the second preliminary capping layer 125 on the side surface of the first mask pattern 115 may have a thickness less than or equal to half a width of the first mask pattern 115.

Here, when the first preliminary capping layer 120 includes the heterocyclic compound having the nitrogen atom, the nitrogen atom in the heterocyclic compound may be ionically bonded with a hydrogen atom in the first mask pattern 115 to form the second preliminary capping layer 125 on the first mask pattern 115.

Figure 3:
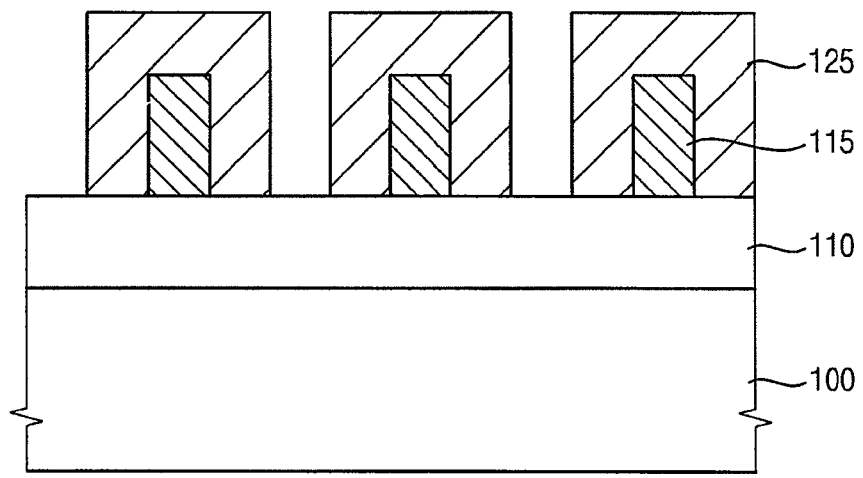

Referring to FIG. 3, a remaining portion of the first preliminary capping layer 120, i.e., a portion not converted into the second preliminary capping layer 125, may be removed by a cleaning process using deionized water.

Figure 4:
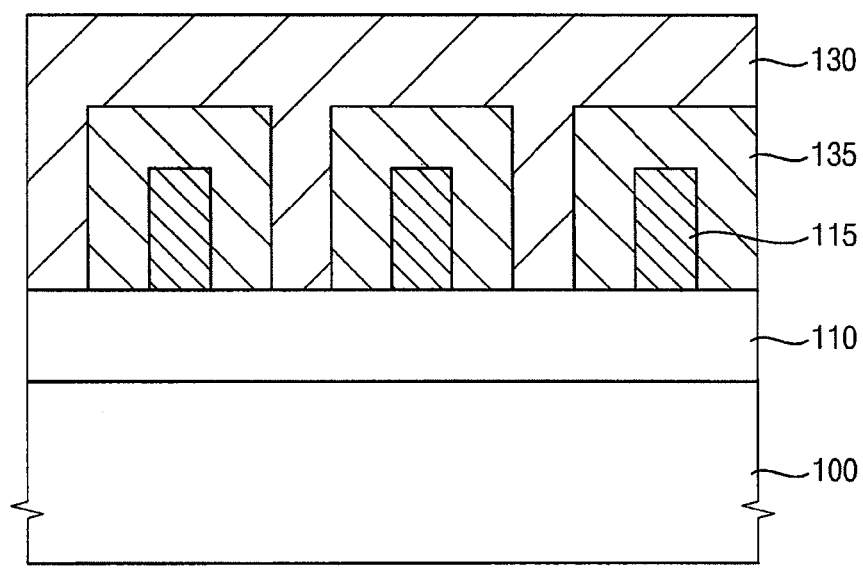

Referring to FIG. 4, an acidic layer 130 may be formed on the layer 110 to cover the second preliminary capping layers 125. The acidic layer 130 may increase an acidic degree of the second preliminary capping layers 125. In an implementation, the acidic layer 130 may include, e.g., nonafluorobutanesulfonic acid, camphorsulfonic acid, etc.

The acidic layer 130 may then be thermally treated at a temperature of about 25° C. to about 200° C. for about 30 seconds to about 180 seconds, thus allowing a relatively great amount of acid in the acidic layer 130 to diffuse into the second preliminary capping layer 125, thereby forming a capping layer 135 including a relatively great amount of the acid.

Here, a concentration of the acid in the capping layer 135 may be determined in accordance with a concentration of acid in the acidic layer 130 and the temperature and the time of the thermal treatment process. Therefore, the temperature and the time of the thermal treatment process may vary in accordance with process conditions for a desired device.

Figure 5:
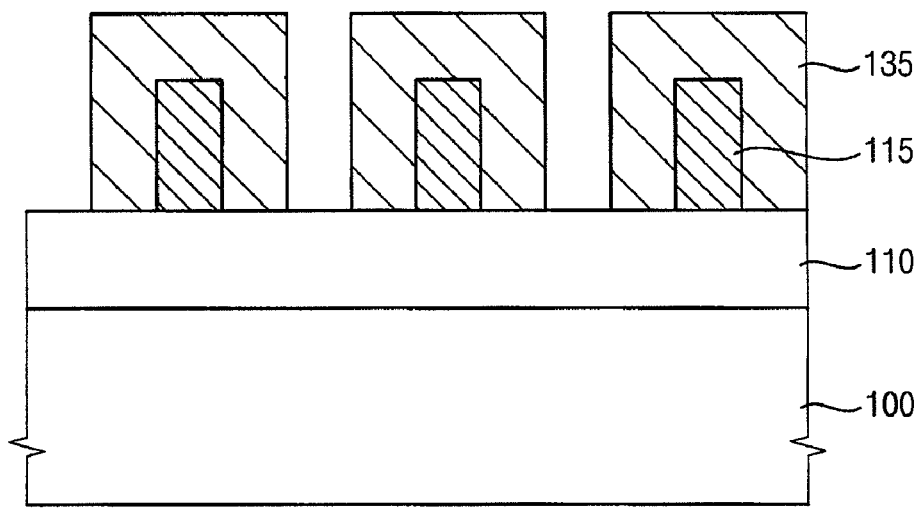

Referring to FIG. 5, a remaining portion of the acidic layer 130, i.e., a portion of the acidic layer 130 not converted into the capping layer 135, may be removed by, e.g., a spin-dry process. As a result, only the capping layer 135 having a sufficient amount of the acid may remain on the first mask patterns 115.

Figure 6:
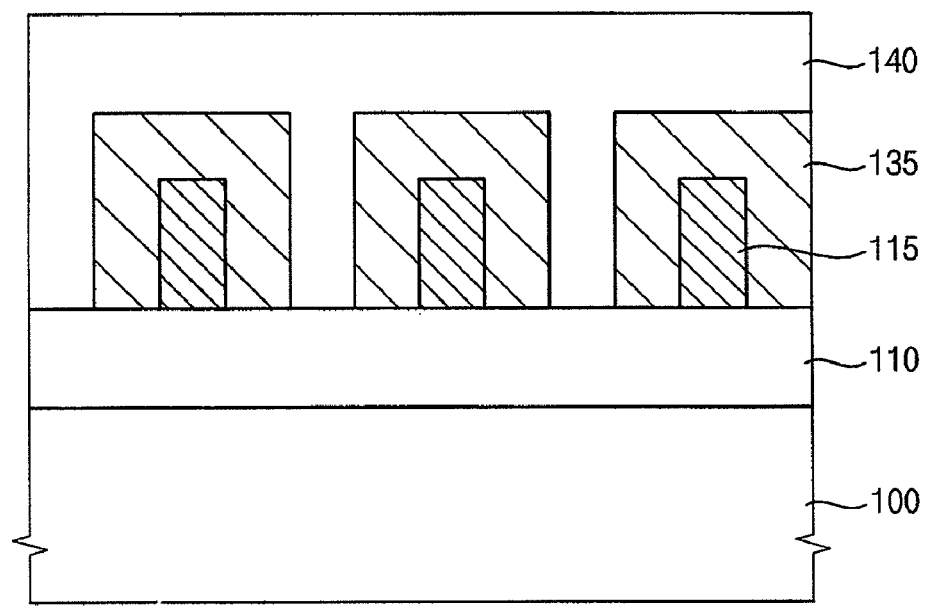

Referring to FIG. 6, a second mask layer 140 may be formed on the layer 110 and the capping layer 135 to fill up gaps in the capping layer 135.

In an implementation, the second mask layer 140 may include a photoresist material. Particularly, the second mask layer 140 may include, e.g., positive type photoresist or negative type photoresist. For example, the second mask layer 140 may include KrF excimer-laser (248 nm) photoresist, ArF excimer-laser (193 nm) photoresist, $F_2$ excimer-laser (157 nm) photoresist, etc. As described above, the first mask pattern 115 may include negative type photoresist. Here, because following processes may not use an acid, the second mask layer 140 may include a material without acid such as a photoacid generator (PAG) or a thermal acid generator (TAG).

In an implementation, the second mask layer 140 may include a material having a solubility lower than that of the capping layer 135 with respect to an alkaline solution, e.g., a tetramethylammonium hydroxide (TMAH) solution. For example, the solubility of the second mask layer 140 with respect to the alkaline solution may be about 1 Å/s to about 10 Å/s. Particularly, the second mask layer 140 may have a low dark erosion characteristic, which may mean that non-exposed portions of the photoresist film may be dissolved or developed by a developing solution. The second mask layer 140 may include a polymer having, e.g., a polyhydroxy styrene monomer unit, a polymer having an acetal monomer unit, a polymer having acrylate monomer unit, etc.

The second mask layer 140 may then be thermally treated to diffuse the acids in the capping layer 135 into the second mask layer 140.

Figure 7:
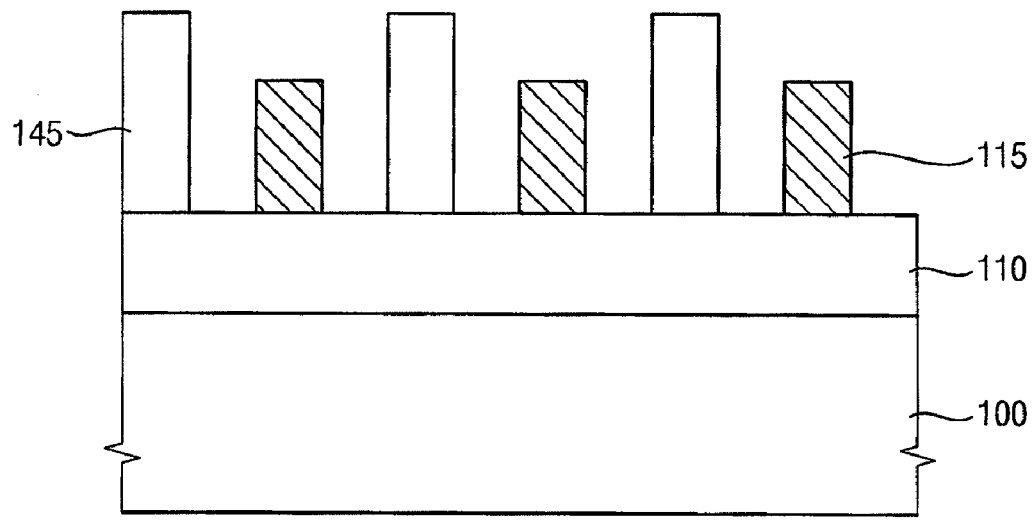

Referring to FIG. 7, a solvent may be applied to the second mask layer 140 to dissolve portions of the second mask layer 140, thereby forming second mask patterns 145. In an implementation, the solvent may include an alkaline solution, e.g., a TMAH solution. The solvent may dissolve portions of the second mask patterns 145 and the capping layers 135. Here, because the solubility of the second mask layer 140 may be lower than that of the capping layer 135, the capping layer 135 may be removed in advance the second mask layer 140. During removal of the capping layer 135, the diffused portion of the acids in the second mask layer 140 may be dissolved to form the second mask patterns 145. In other words, portions of the capping layer 135 and the second mask layer 140 including acid therein may be removed, thus leaving the first mask patterns 115 and the second mask patterns 145.

In an implementation, the second mask patterns 145 may have a pitch of about two times that of a desired pattern formed from the layer 110. Further, the second mask patterns 145 may have a width substantially the same as that of the desired pattern of the layer 110.

Figure 8:
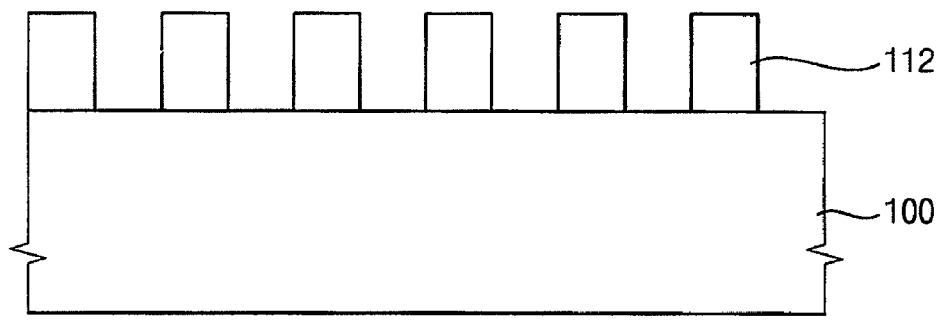

Referring to FIG. 8, the layer 110 may be etched using the first mask patterns 115 and the second mask patterns 145 to form a desired minute pattern 112. The first mask patterns 115 and the second mask patterns 145 may then be removed using, e.g., a stripping process and/or an ashing process.

According to the present embodiment, the minute pattern may be readily formed by the double patterning process using the mask patterns having different solubilities.

Further, odd patterns and even patterns in the minute pattern may have substantially the same shape by the double patterning process, so that semiconductor devices manufactured according to the present embodiment may have uniform electrical characteristics.

FIGS. 9 to 20 illustrate cross-sectional views of stages in a method of manufacturing a NAND flash semiconductor device in accordance with an embodiment.

Figure 9:
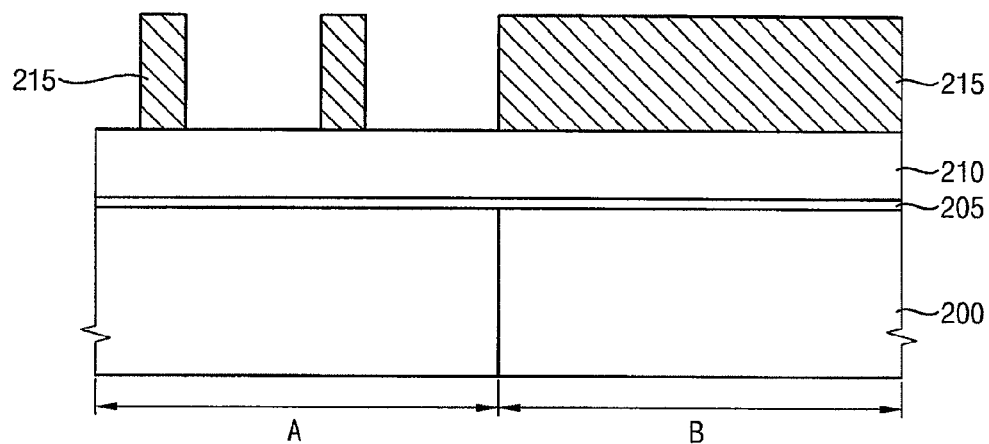
FIGS. 9 to 20 illustrate cross-sectional views of stages in a method of manufacturing a NAND flash semiconductor device in accordance with an embodiment.

Referring to FIG. 9, a semiconductor substrate 200 may have a memory cell region A and a peripheral circuit region B. In an implementation, the semiconductor substrate 200 may include, e.g., a silicon substrate, a silicon-on-insulator (SOI) substrate, etc.

A tunnel insulating layer 205 may be formed on the semiconductor substrate 200. In an implementation, the tunnel insulating layer 205 may include, e.g., an oxide layer. An electrode layer 210 may be formed on the tunnel insulating layer 205. First mask patterns 215 may be formed on the electrode layer 210.

In an implementation, the tunnel insulating layer 205 may have a thickness of about 50 Å to about 100 Å. In order to improve reading and writing operations of the flash memory device, it may be desirable to provide the tunnel insulating layer 205 with good properties and strong durability. The tunnel insulating layer 205 may be formed by, e.g., a radical oxidation process.

In an implementation, the electrode layer 210 may be converted into a floating gate. The electrode layer 210 may be formed by, e.g., a chemical vapor deposition (CVD) process. The electrode layer 210 may have a thickness of about 500 Å to about 1,500 Å. Further, in order to improve properties of the electrode layer 210, the electrode layer 210 may be formed by primarily depositing a first layer having a thickness of about 300 Å and secondarily depositing a second layer having a thickness of about 200 Å to about 1,200 Å on the first layer.

In an implementation, the first mask patterns 215 may include, e.g., a photoresist pattern. The first mask patterns 215 may include, e.g., a positive type photoresist having a PAG.

The first mask patterns 215 may then be cured. In an implementation, the curing process may include providing, e.g., heat, Ar plasma, HBr plasma, etc., to the first mask patterns 215. When the curing process includes heating, the first mask patterns 115 may be thermally treated at a temperature of about 50° C. to about 200° C. for about 1 minute.

Figure 10:
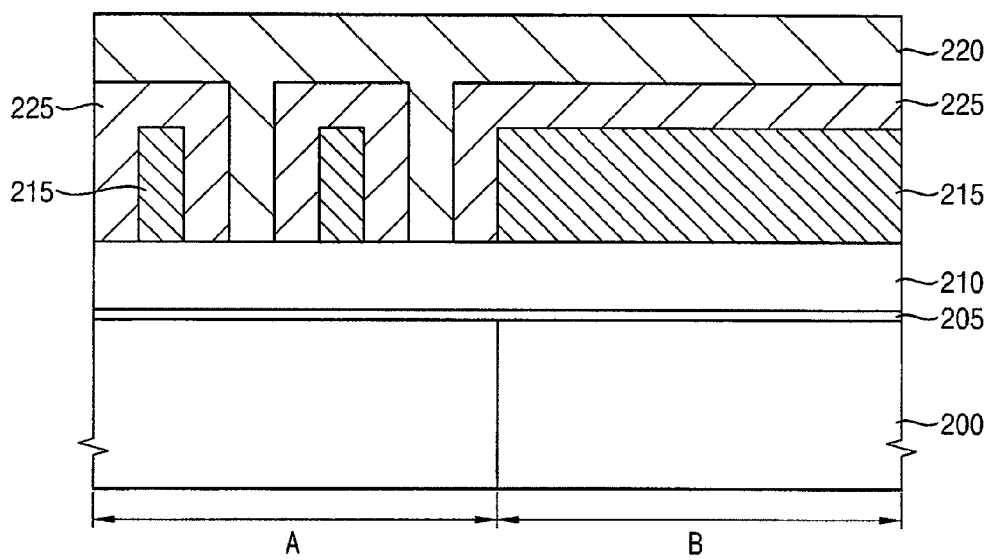

Referring to FIG. 10, a first preliminary capping layer 220 may be formed on the electrode layer 210 to cover the first mask patterns 215.

In an implementation, the first preliminary capping layer 220 may include, e.g., a hydrophilic organic compound. Further, the first preliminary capping layer 120 may include, e.g., a heterocyclic compound having a nitrogen atom and/or a polymer including a substituent that has a heterocyclic compound having a nitrogen atom. For example, the first preliminary capping layer 220 may include a pyrrolidone polymer.

The substrate 200 including the first preliminary capping layer 220 thereon may then be baked or irradiated with energy to form a second preliminary capping layer 225 on upper surfaces and side surfaces of the first mask patterns 215. In an implementation, the substrate 200 including the first preliminary capping layer 220 thereon may be baked at a temperature of about 120° C. to about 180° C. for about 20 seconds to about 70 seconds.

In an implementation, the second preliminary capping layer 225 may have a thickness varying in accordance with a width of a desired gate pattern to be formed from the electrode layer 210. For example, a portion of the second preliminary capping layer 225 on the side surface of the first mask pattern 215 may have a thickness less than or equal to half a width of the first mask pattern 215.

Here, when the first preliminary capping layer 220 includes the heterocyclic compound having the nitrogen atom, the nitrogen atom in the heterocyclic compound may be ionically bonded with a hydrogen atom in the first mask pattern 215 to form the second preliminary capping layer 225 on the first mask pattern 215.

Figure 11:
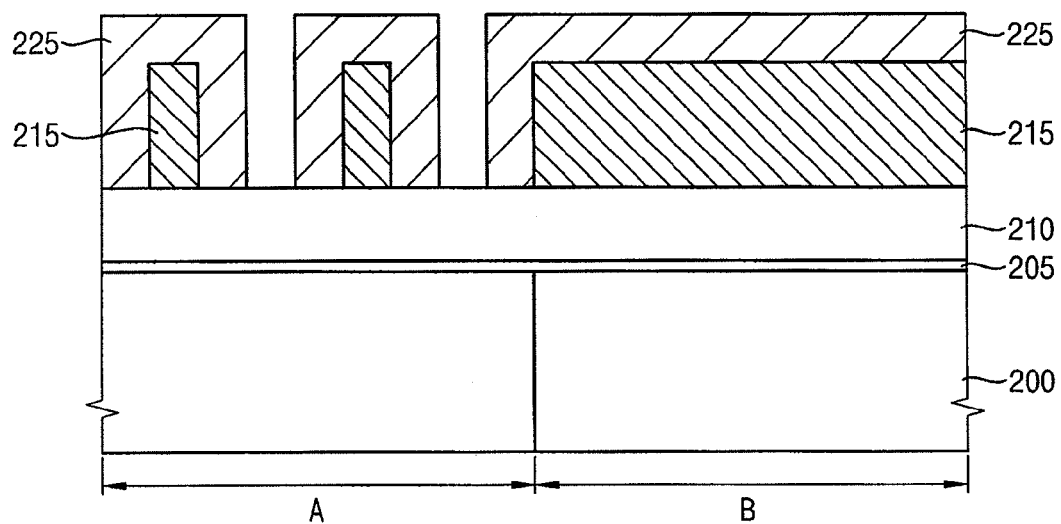

Referring to FIG. 11, a remaining portion of the first preliminary capping layer 220, i.e., a portion not converted into the second preliminary capping layer 225, may be removed by a cleaning process using deionized water.

Figure 12:
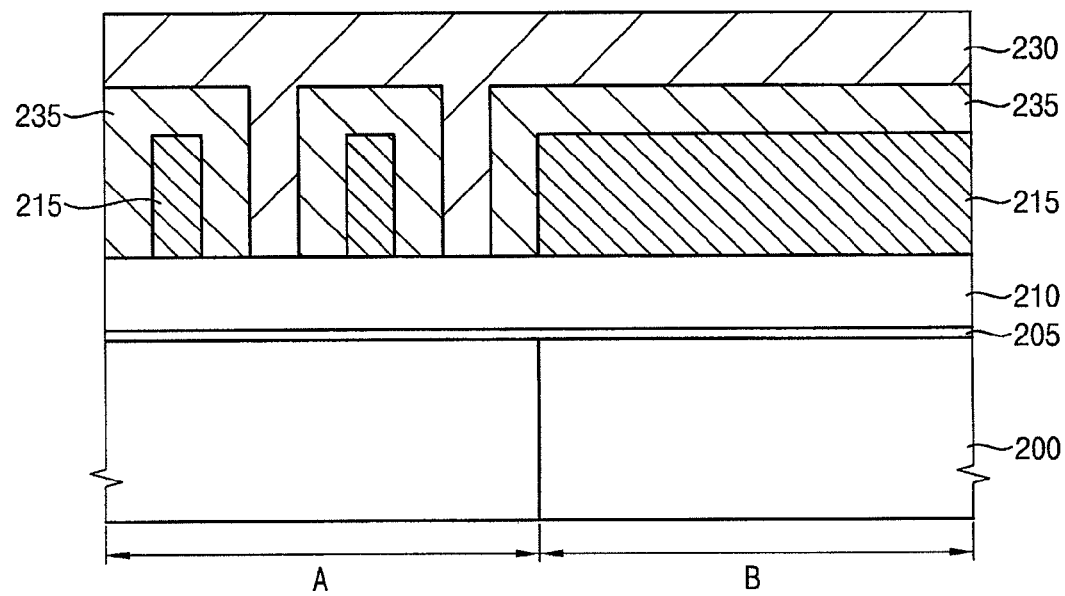

Referring to FIG. 12, an acidic layer 230 may be formed on the electrode layer 210 to cover the second preliminary capping layers 225. The acidic layer 230 may increase an acidic degree of the second preliminary capping layers 225. In an implementation, the acidic layer 230 may include, e.g., nonafluorobutanesulfonic acid, camphorsulfonic acid, etc.

The acidic layer 230 may then be thermally treated at a temperature of about 25° C. to about 200° C. for about 30 seconds to about 180 seconds, thus allowing a relatively great amount of acid in the acidic layer 230 to diffuse into the second preliminary capping layer 225, thereby forming a capping layer 235 including a relatively great amount of the acids.

Here, a concentration of the acid in the capping layer 235 may be determined in accordance with the concentration of acid the acidic layer 230 as well as the temperature and the time of the thermal treatment process. Therefore, the temperature and the time of the thermal treatment process may vary in accordance with process conditions suitable for the desired device.

Figure 13:
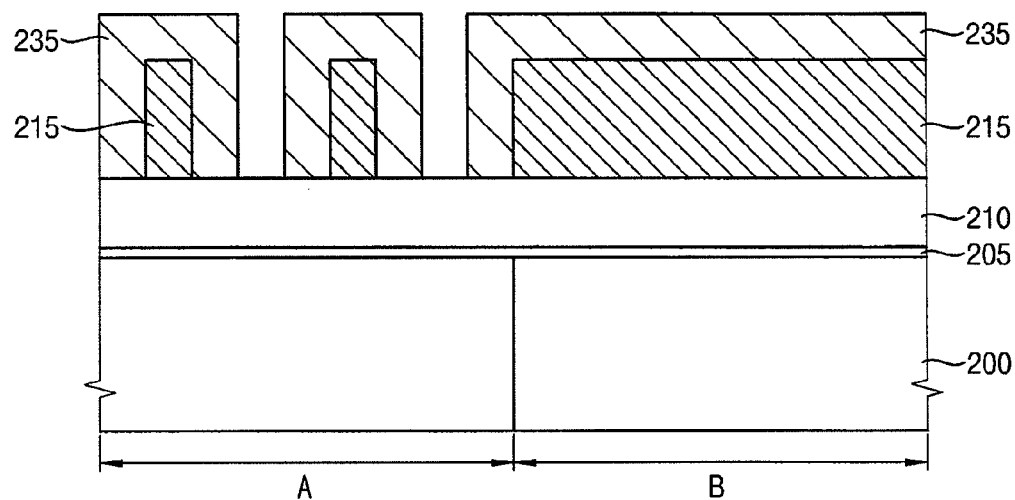

Referring to FIG. 13, a remaining portion of the acidic layer 230, i.e., a portion not converted into the capping layer 235, may be removed by a spin-dry process. As a result, only the capping layer 235 having a sufficient amount of the acid may remain on the first mask patterns 215.

Figure 14:
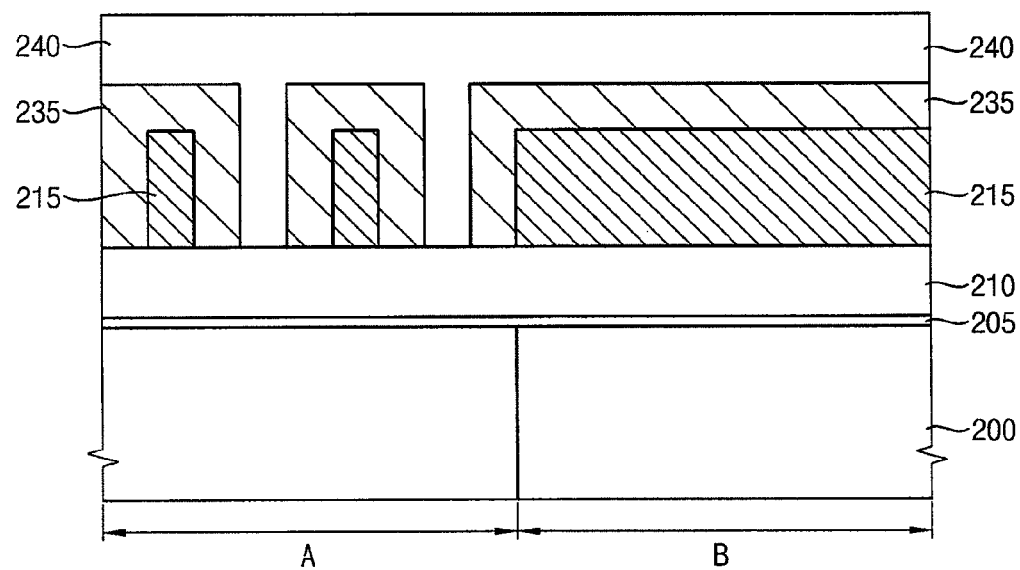

Referring to FIG. 14, a second mask layer 240 may be formed on the electrode layer 210 and the capping layer 235 to fill up gaps in the capping layer 235.

In an implementation, the second mask layer 240 may include a photoresist material. The second mask layer 240 may include a material having solubility lower than that of the capping layer 235 with respect to an alkaline solution, e.g., a tetramethylammonium hydroxide (TMAH) solution. For example, the solubility of the second mask layer 240 with respect to the alkaline solution may be about 1 Å/s to about 10 Å/s. Particularly, the second mask layer 240 may have a low dark erosion characteristic, which may mean that a non-exposed photoresist film may be dissolved or developed by a developing solution. The second mask layer 240 may include, e.g., a polymer having a polyhydroxy styrene monomer unit, a polymer having an acetal monomer unit, a polymer having acrylate monomer unit, etc.

The second mask layer 240 may then be thermally treated to diffuse the acids in the capping layer 235 into the second mask layer 240.

Figure 15:
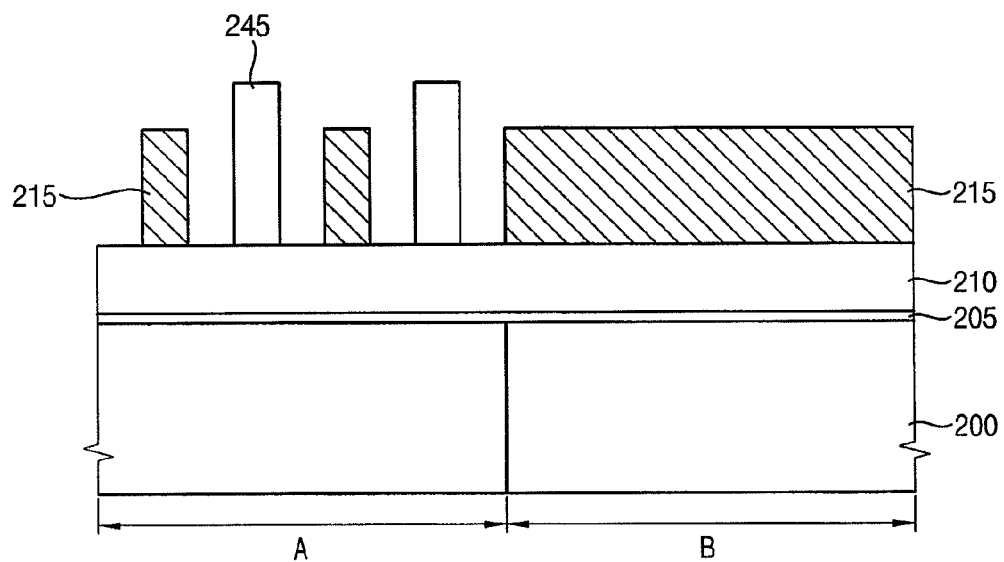

Referring to FIG. 15, a solvent may be applied to the second mask layer 240 to dissolve portions of the second mask layer 240, thereby forming a second mask pattern 245. In an implementation, the solvent may include an alkaline solution, e.g., a TMAH solution. The solvent may then dissolve portions of the second mask layer 240 and the capping layer 235. Here, because the solubility of the second mask layer 240 may be lower than that of the capping layer 235, the capping layer 235 may be removed before the second mask layer 240. During removal of the capping layer 235, the diffused portion of the acid in the second mask layer 240 may also be dissolved and removed to form the second mask patterns 245.

Figure 16:
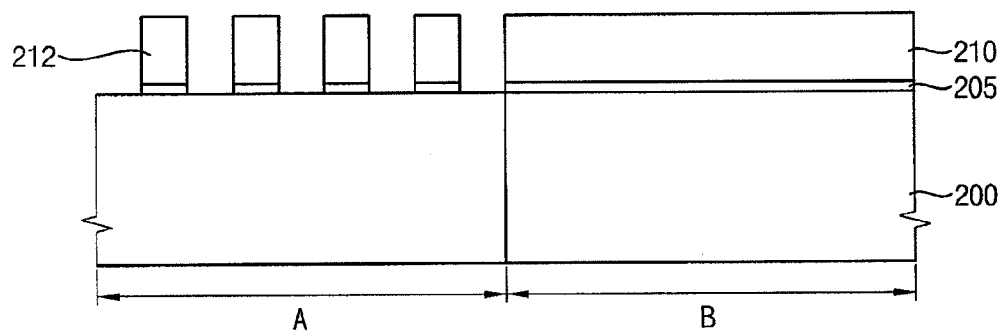

Referring to FIG. 16, the electrode layer 210 in the memory cell region A may be etched using the first mask patterns 215 and the second mask patterns 245 to form the floating gate electrodes 212. The first mask patterns 215 and the second mask patterns 245 may then be removed using, e.g., a stripping process and/or an ashing process.

Figure 17:
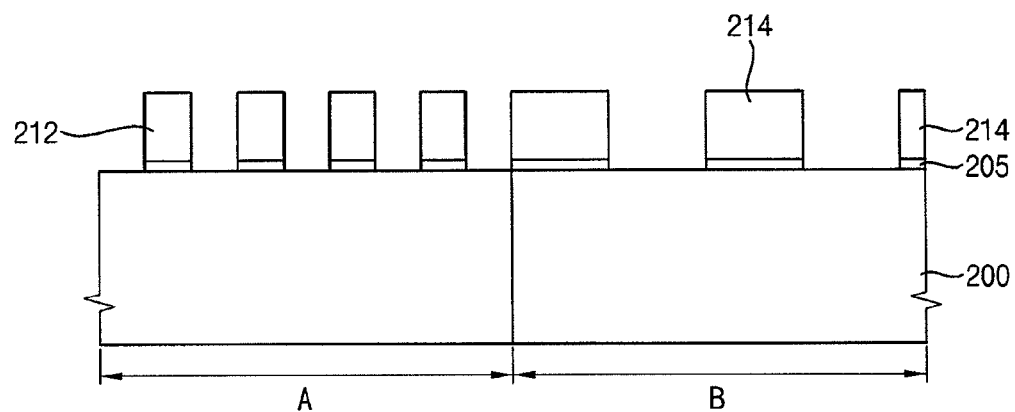

Referring to FIG. 17, the electrode layer 210 in the peripheral circuit region B may be etched to form high/low voltage electrodes 214.

Figure 18:
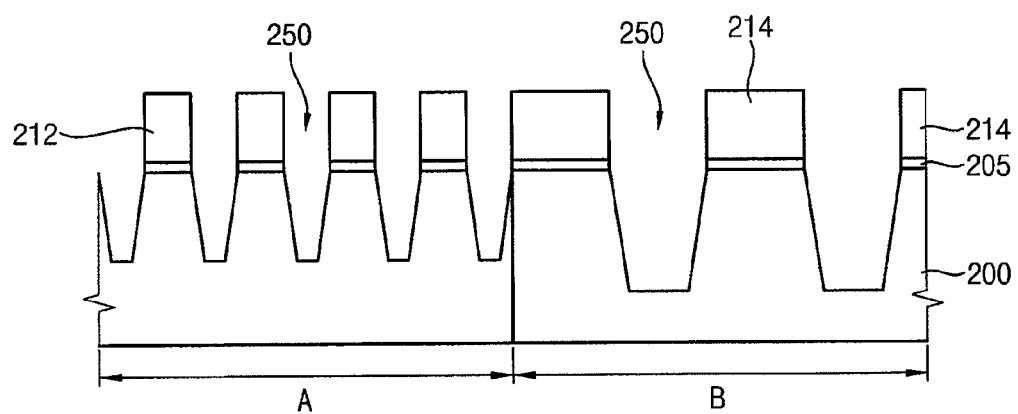

Referring to FIG. 18, the semiconductor substrate 200 may be etched using the high/low voltage electrodes 214 and the floating gate electrodes 212 as an etch mask to form trenches 250. In an implementation, the trenches 250 may have a slanted side surface. The slanted side surface of the trenches 250 may facilitate fully filling the trenches 250 with isolation layers and may disperse stresses, which may be generated when the isolation layers and the semiconductor substrate 200 may have different physical characteristics, concentrated on a channel of the flash memory device.

Figure 19:
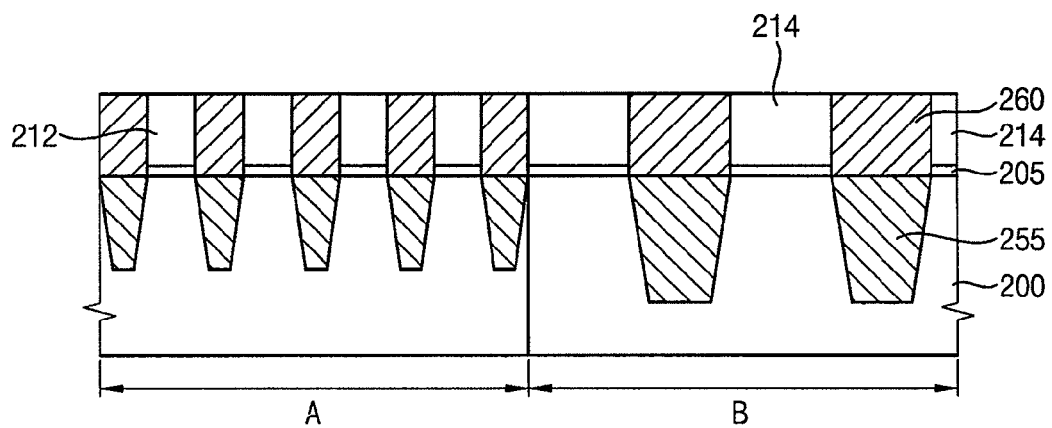

Referring to FIG. 19, the trenches 250 may be partially filled with first isolation layers 255. In an implementation, the first isolation layers 255 may include, e.g., polysilazane, USG, etc. Additionally, the first isolation layers 255 may be planarized by a chemical mechanical polishing (CMP) process or an etch-back process until an upper surface of the semiconductor substrate 200 is exposed or the first isolation layers 255 is substantially aligned with the upper surface of the semiconductor substrate 200. Upper portions of the trenches 250 may be filled with second isolation layers 260. The second isolation layers 260 may be planarized by a CMP process or an etch-back process until upper surfaces of the floating gates 212 and the high/low voltage electrodes 214 are exposed. The second isolation layers 260 may include, e.g., a high-density plasma CVD oxide layer. Further, the second isolation layers 260 may have a thickness of about 2,000 Å to about 4,000 Å. Additionally, impurity regions may be formed at surface portions of the semiconductor substrate 200 prior to forming the trenches 250.

Figure 20:
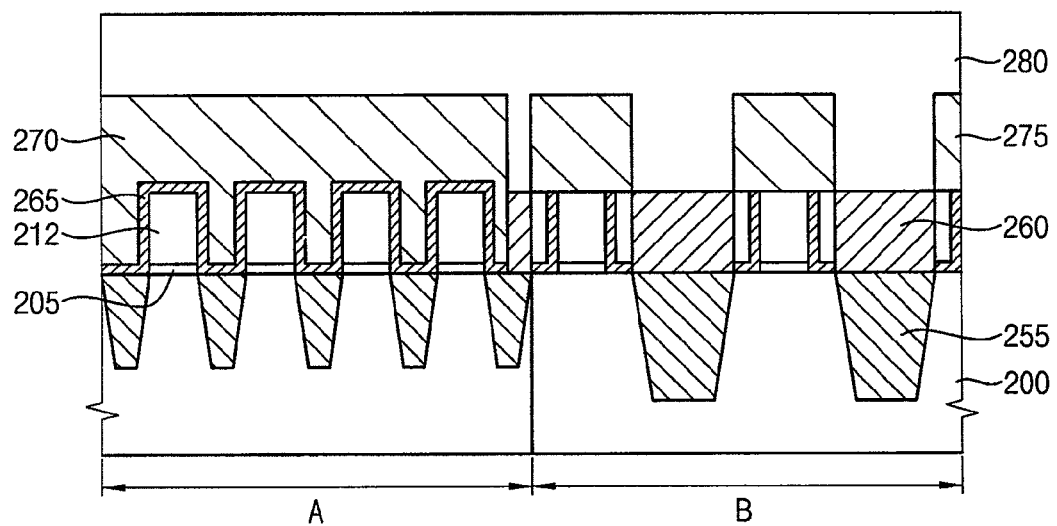

Referring to FIG. 20, the second isolation layers 260 in the memory cell region A may be removed. A dielectric layer 265 may be formed on the floating gates 212. A control gate 270 may be formed on the dielectric layer 265.

A planarization layer 280 may be formed on the control gate 270 and the high/low voltage electrodes 214 in the peripheral circuit region B. Although not depicted in drawings, metal wirings and a protecting layer may be sequentially formed on the planarization layer 280 to complete the flash memory device of this example embodiment.

Figure 21:
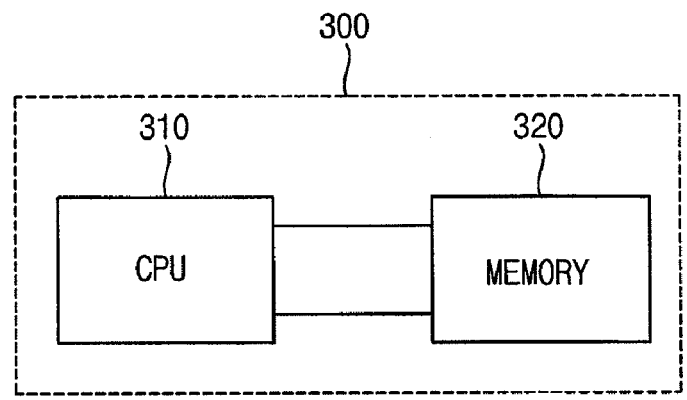
FIG. 21 illustrates a block diagram of a system including the NAND flash memory device in FIG. 20 in accordance with an embodiment.

FIG. 21 illustrates a block diagram of a system including the NAND flash memory device of FIG. 20 in accordance with an embodiment.

Referring to FIG. 21, a memory 320 may be connected with a central processing unit (CPU) 310. The memory 320 may include the NAND flash memory device of FIG. 20. Alternatively, the memory 320 may include a NOR flash memory device.

The CPU 310 may input a signal into the memory 320 to control operations of the memory 320. In an implementation, the signal may include a command signal, an address signal, an input/output signal, etc. The CPU 310 may control data in the flash memory device in accordance with the signal. The memory 320 may be used in a personal computer, a personal data assistant device, etc.

Figure 22:
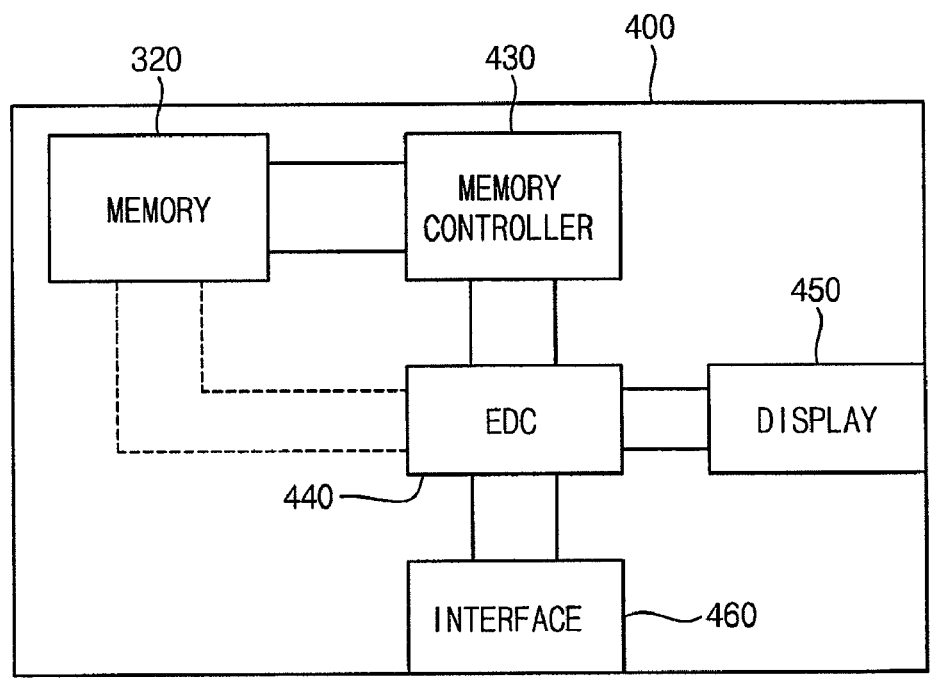
FIG. 22 illustrates a block diagram of a system including the NAND flash memory device in FIG. 20 in accordance with another embodiment.

FIG. 22 illustrates a block diagram of a system including the NAND flash memory device of FIG. 20 in accordance with an embodiment.

Referring to FIG. 22, a portable device 400 of the present embodiment may include, e.g., an MP3 player, a video player, etc. The portable device 400 may include a memory 320, a memory controller 430, an encoder/decoder (EDC) 440, a display 450, and an interface 460. In an implementation, the memory 320 may include the NAND flash memory device of FIG. 20.

Data may be inputted/outputted into/from the memory 320 through the memory controller 430 by the encoder/decoder 440. As shown dotted lines in FIG. 22, the data may be directly inputted into the memory 320. Further, the data may be outputted from the encoder/decoder 440 from the memory 320.

The encoder/decoder 440 may encode the data in the memory 320. For example, the encoder/decoder 440 may perform an MP3 encoding and a PMP encoding for storing the data in an audio player and a video player. Alternatively, the encoder/decoder 440 may perform an MPEG encoding for storing video data in the memory 320. Further, the encoder/decoder 440 may include a multi-encoder for encoding data having different types in accordance with different formats. For example, the encoder/decoder 440 may include an MP3 encoder for audio data and an MPEG encoder for video data.

In an implementation, the encoder/decoder 440 may include only a decoder. For example, the decoder may receive and transmit data to the memory controller 430 or the memory 320.

In an implementation, the encoder/decoder 440 may receive data for encoding or encoded data through the interface 460. The interface 460 may include a USB interface. The data may be outputted from the interface 460 through the memory 320.

The displayer 450 may display the data outputted from the memory 320 or decoded by the encoder/decoder 440. For example, the displayer 450 may include a speaker jack for outputting audio data, a display screen for outputting video data, etc.

According to the embodiments, the minute pattern may be readily formed by the double patterning process using the mask patterns having different solubilities.

Further, odd patterns and even patterns in the minute pattern may be formed to have substantially the same shape by the double patterning process, so that semiconductor devices manufactured by the embodiments may have uniform electrical characteristics.

The double patterning process according to embodiments may circumvent any need for performing a deposition process and an etching process in a small opening having a high aspect ratio, and thus such a process according to the embodiments may reduce the costs and difficulty of the process.

According to some example embodiments, the minute pattern may be readily formed by the double patterning process using the mask patterns that may have different solubilities.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a mask pattern, the method comprising:
   forming first mask patterns on a substrate;
   forming first preliminary capping layers on the first mask patterns;
   irradiating energy to the first preliminary capping patterns to form second preliminary capping layers ionically bonded with the first mask patterns;
   applying an acid to the second preliminary capping layers to form capping layers;
   forming a second mask layer between the capping layers, the second mask layer having a solubility lower than that of the capping layers; and
   removing the capping layers to form second mask patterns.

2. The method as claimed in claim 1, wherein the acid includes nonafluorobutanesulfonic acid or camphorsulfonic acid.

3. The method as claimed in claim 1, wherein the capping layers include a heterocyclic compound having a nitrogen atom.

4. The method as claimed in claim 3, wherein the capping layers are attached to the first mask patterns by ionically bonding the nitrogen atom with a hydrogen atom in the first mask patterns.

5. The method as claimed in claim 1, wherein removing the capping layers includes applying an alkaline solution to the capping layers.

6. The method as claimed in claim 1, wherein forming the second mask patterns includes adjusting a width thereof by diffusion of acid from the capping layers.

7. The method as claimed in claim 1, wherein the first mask patterns have a width substantially the same as a width of the second mask patterns.

8. A method of forming a minute pattern, the method comprising:
   forming a layer on a substrate;
   forming first mask patterns on the layer;
   forming first preliminary capping layers on the first mask patterns;
   irradiating energy to the first preliminary capping patterns to form second preliminary capping layers ionically bonded with the first mask patterns;
   applying acid to the second preliminary capping layers to form capping layers;
   forming a second mask layer between the capping layers, the second mask layer having a solubility lower than that of the capping layers;
   removing the capping layers to form second mask patterns; and
   etching the layer using the first mask patterns and the second mask patterns as an etch mask to form the minute pattern.

9. The method as claimed in claim 8, wherein the layer includes a metal layer or a conductive layer doped with impurities.

10. The method as claimed in claim 8, wherein removing the capping layers includes applying a tetramethylammonium hydroxide (TMAH) solution to the capping layers.

11. The method as claimed in claim 8, wherein forming the second mask patterns includes partially removing portions of the second mask patterns to reduce widths of the second mask patterns.

12. The method as claimed in claim 8, wherein the first mask patterns include an organic material.

13. A method of manufacturing a semiconductor device, the method comprising:
   forming an electrode layer on a substrate;
   forming first mask patterns on the electrode layer;
   forming first preliminary capping layers on the first mask patterns;
   irradiating energy to the first preliminary capping patterns to form second preliminary capping layers ionically bonded with the first mask patterns;
   applying an acid to the second preliminary capping layers to form capping layers;
   forming a second mask layer between the capping layers, the second mask layer having a solubility lower than that of the capping layers;
   removing the capping layers to form second mask patterns; and
   etching the electrode layer using the first mask patterns and the second mask patterns as an etch mask to form gate electrodes.

14. The method as claimed in claim 13, wherein the semiconductor device includes a flash memory device.

15. The method as claimed in claim 13, further comprising forming an isolation layer in the substrate.

16. The method as claimed in claim 13, wherein the gate electrodes have substantially the same width.

17. The method as claimed in claim 13, further comprising forming a control gate over the gate electrodes.

18. The method as claimed in claim 13, wherein the gate electrodes include a metal layer or a conductive layer doped with impurities.

19. The method as claimed in claim 13, wherein forming the second mask patterns includes adjusting a width thereof by diffusion of acid from the capping layers.

20. The method as claimed in claim 13, wherein the capping layers include a heterocyclic compound having a nitrogen atom.

* * * * *